United States Patent [19]

Shimizu et al.

[11] Patent Number: 4,471,373
[45] Date of Patent: Sep. 11, 1984

[54] SEMICONDUCTOR INTEGRATED CIRCUIT DEVICE WITH MEMORY MISFETS AND THIN AND THICK GATE INSULATOR MISFETS

[75] Inventors: Shinji Shimizu, Houya; Kazuhiro Komori; Yasunobu Kosa, both of Kodaira; June Sugiura, Musashino, all of Japan

[73] Assignee: Hitachi, Ltd., Tokyo, Japan

[21] Appl. No.: 223,140

[22] Filed: Jan. 7, 1981

[30] Foreign Application Priority Data

Feb. 27, 1980 [JP] Japan .............................. 55-22760

[51] Int. Cl.³ ...................... H01L 27/02; H01L 29/78
[52] U.S. Cl. ......................................... 357/41; 357/23
[58] Field of Search ............... 357/23 VT, 41, 23 CS, 357/23 D

[56] References Cited

U.S. PATENT DOCUMENTS

| | | | |
|---|---|---|---|
| 3,502,950 | 3/1970 | Nigh et al. | 357/42 |
| 4,003,071 | 1/1977 | Takagi | 357/23 D |
| 4,118,642 | 10/1978 | Richardson | 357/41 |
| 4,300,212 | 11/1981 | Simko | 357/23 VT |

Primary Examiner—Gene M. Munson
Attorney, Agent, or Firm—Kenyon & Kenyon

[57] ABSTRACT

A semiconductor integrated circuit device and a method of manufacturing the same, wherein an MIS type memory transistor of a two-layered gate electrode structure is formed on the surface of a semiconductor substrate, and an MIS type transistor for a low voltage having a comparatively thin gate oxide film and an MIS type transistor for a high voltage having a comparatively thick gate oxide film are formed around the memory transistor.

8 Claims, 28 Drawing Figures

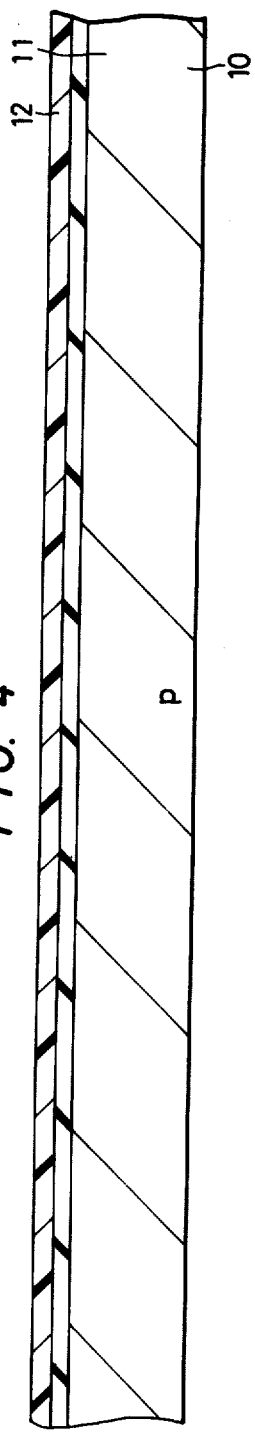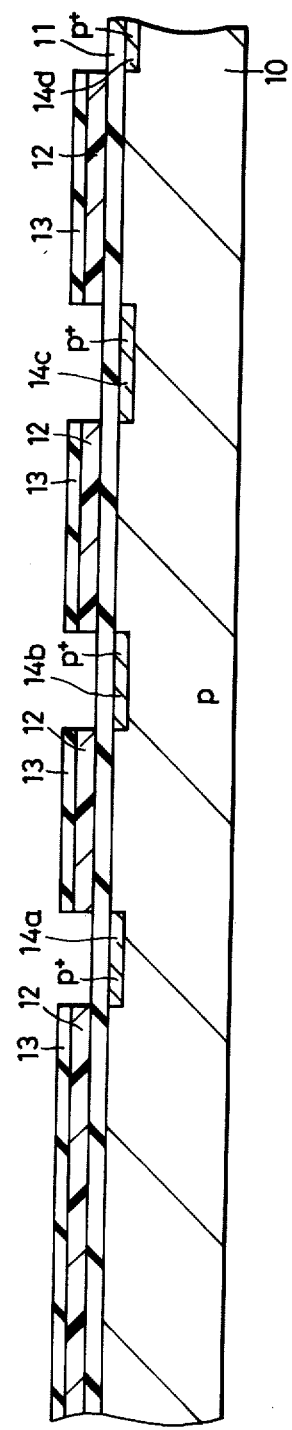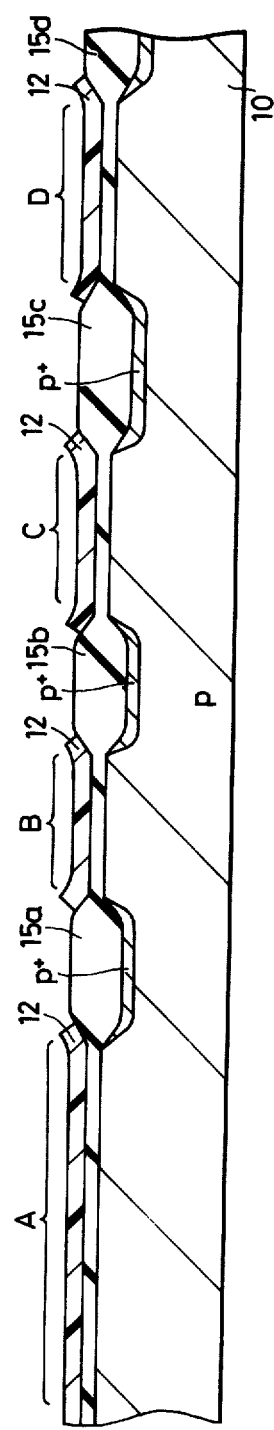

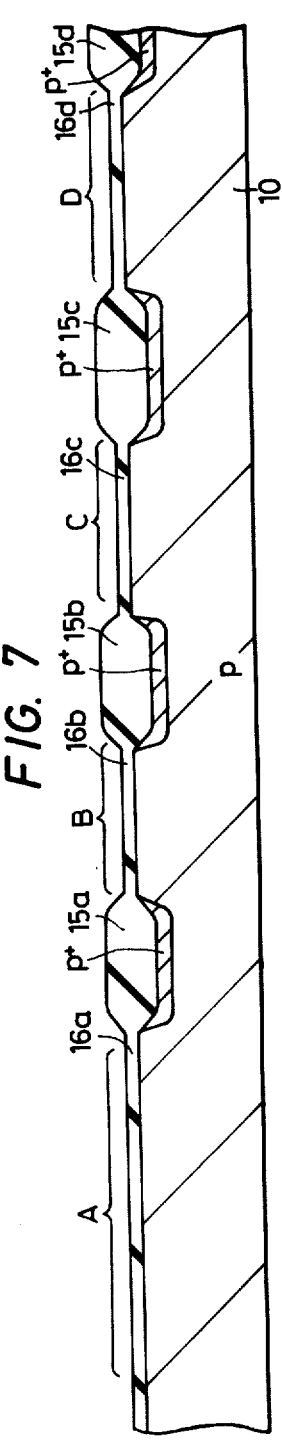
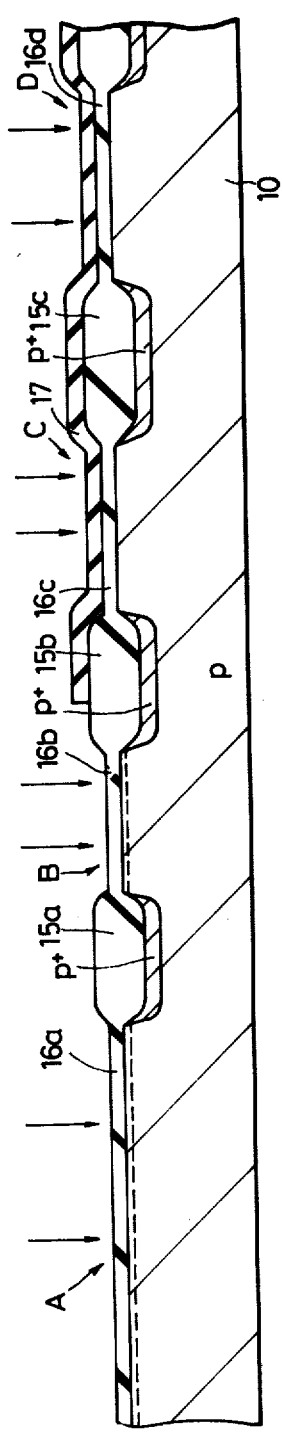
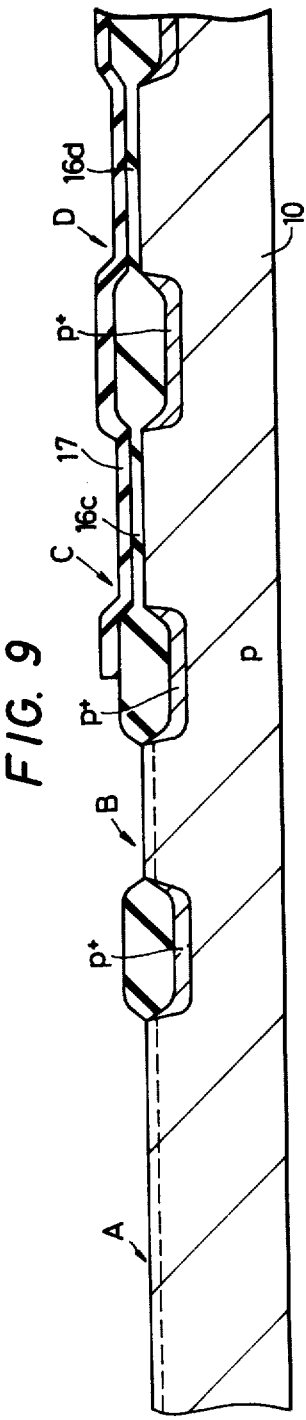

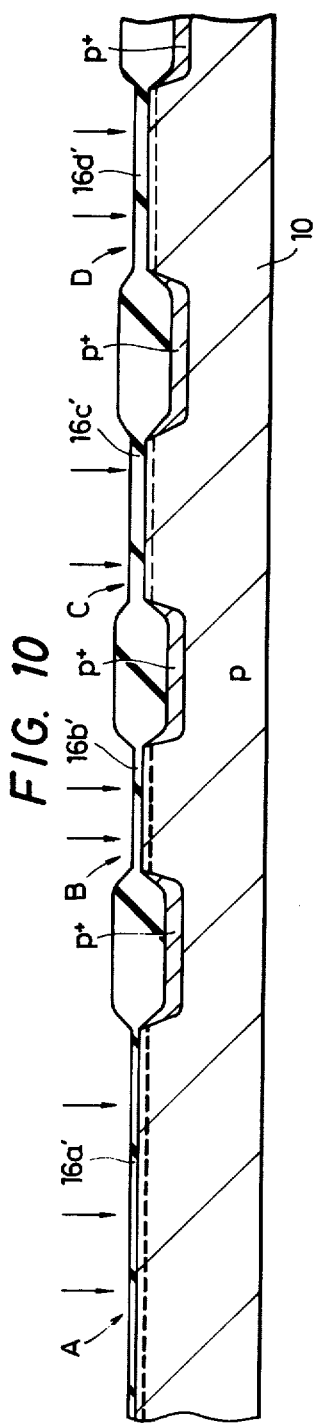
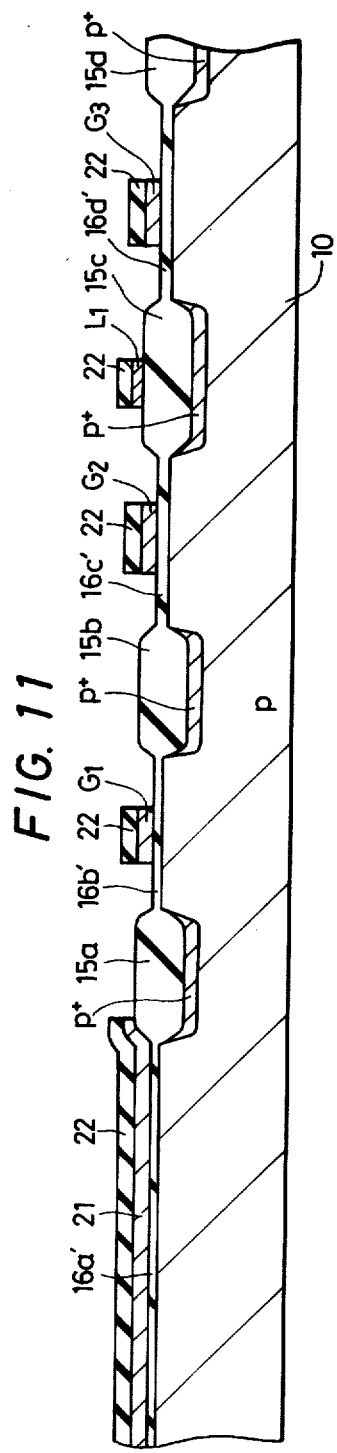
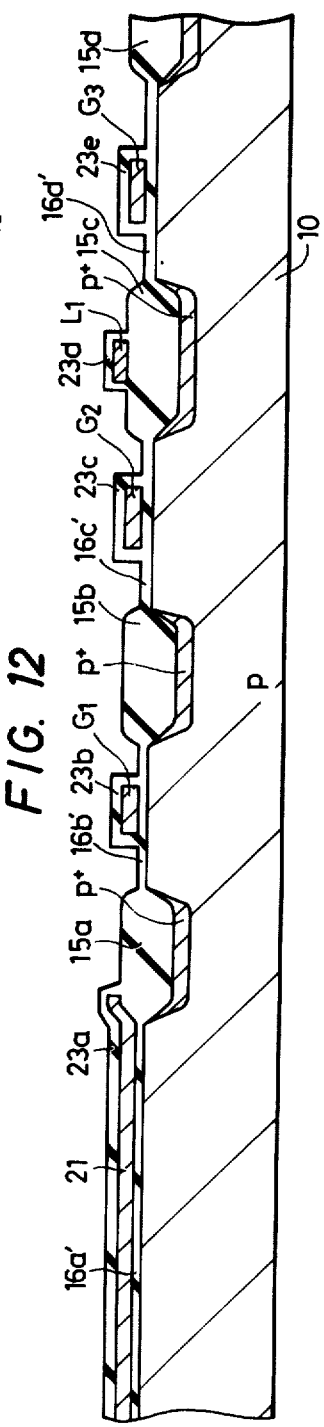
FIG. 10
FIG. 11
FIG. 12

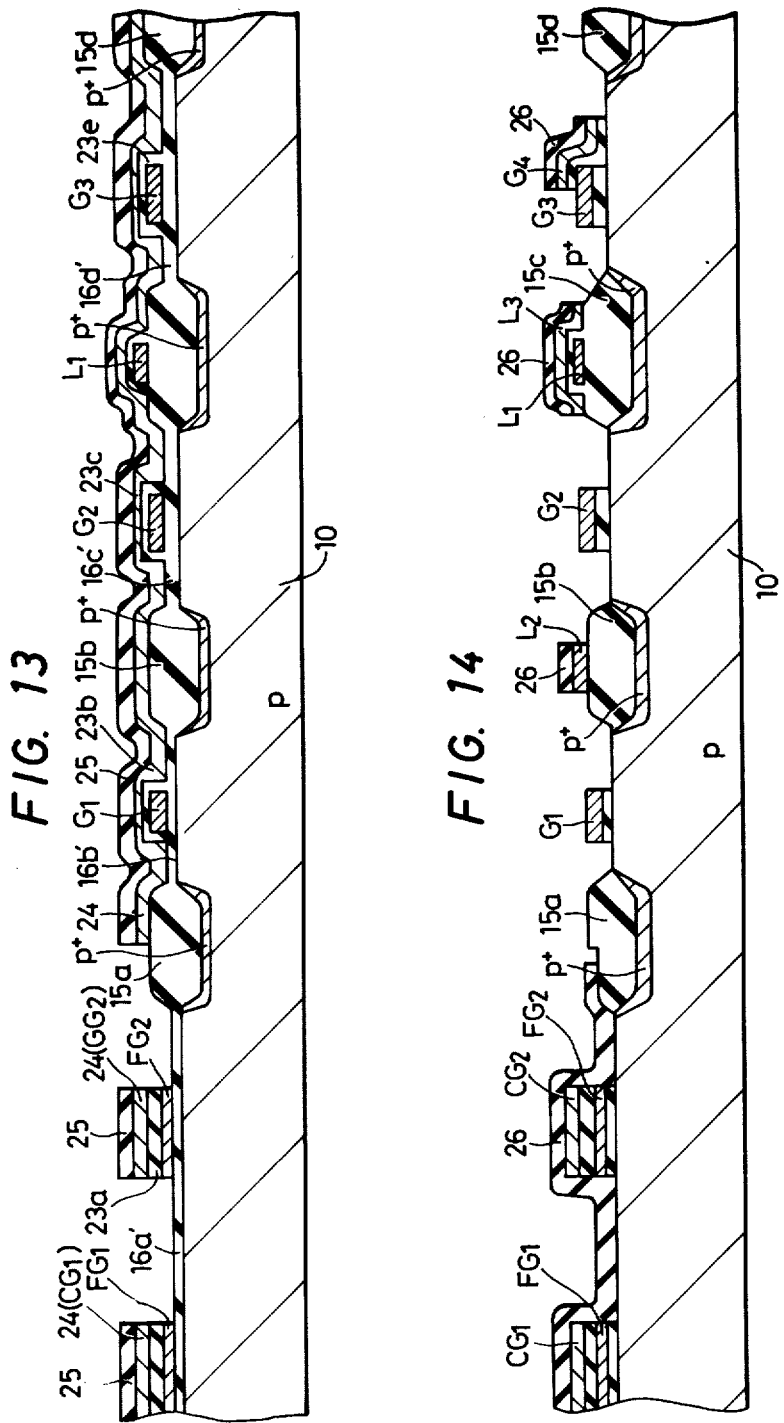

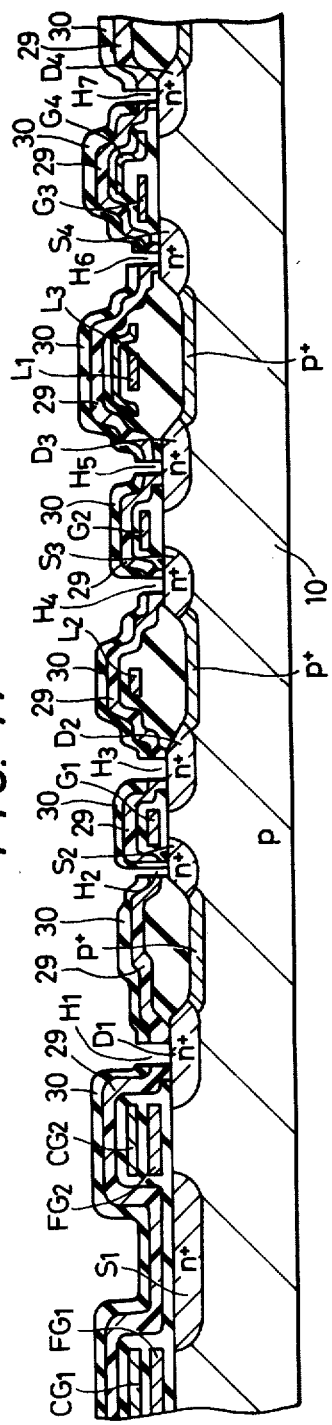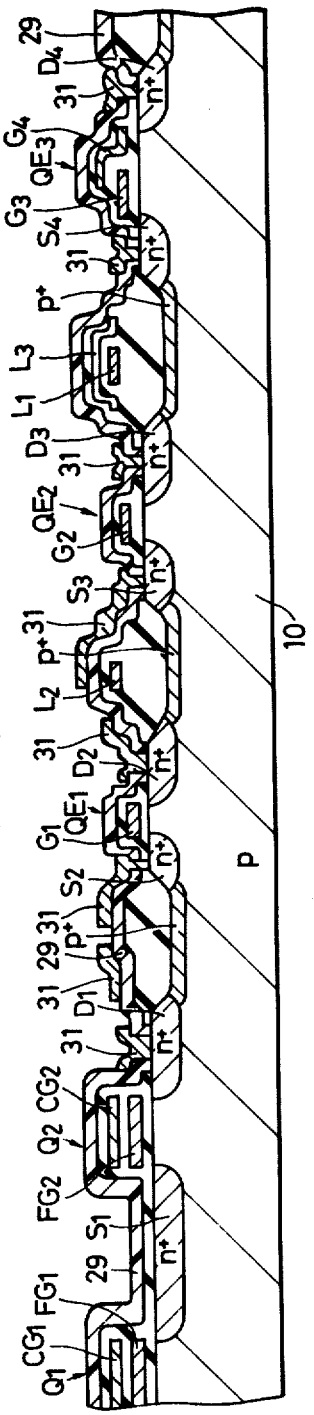

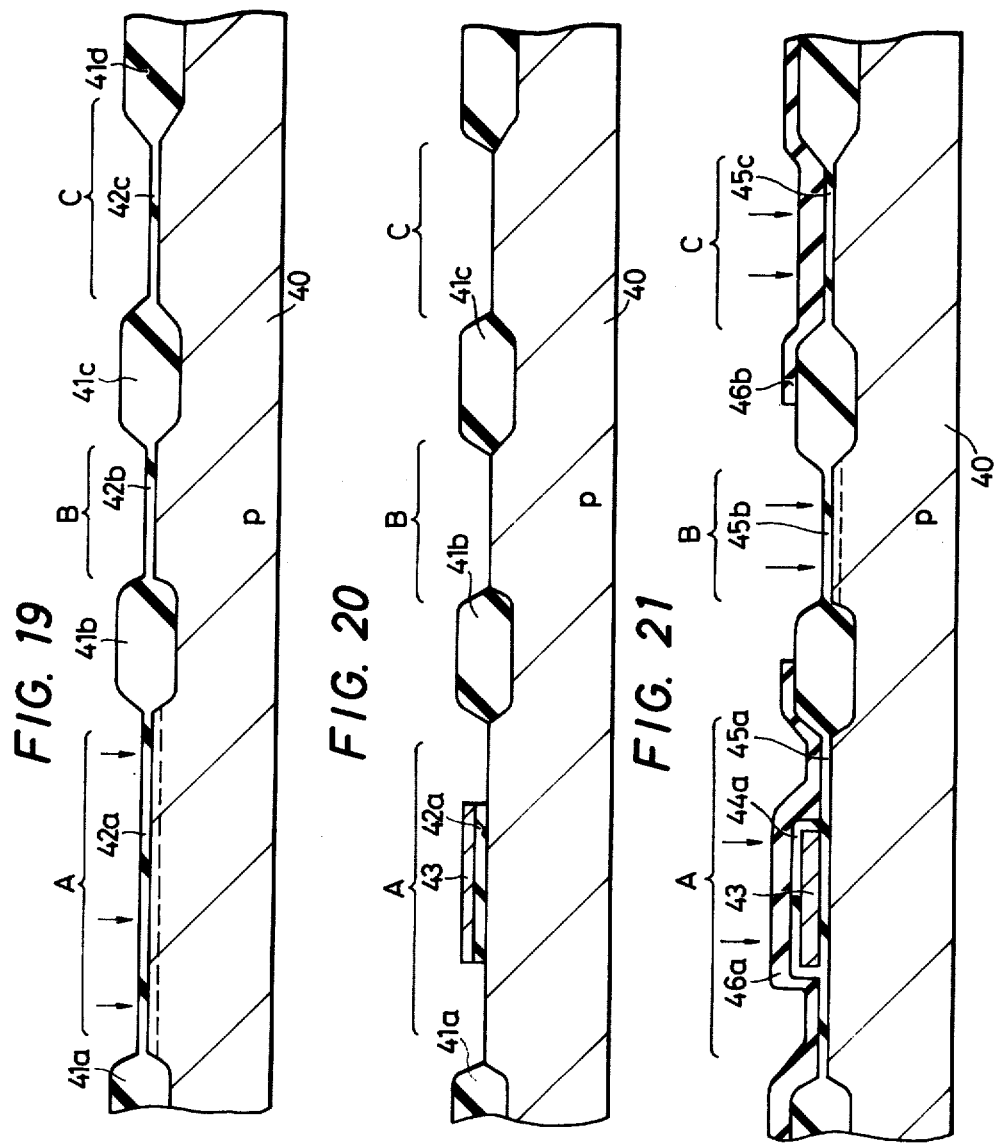

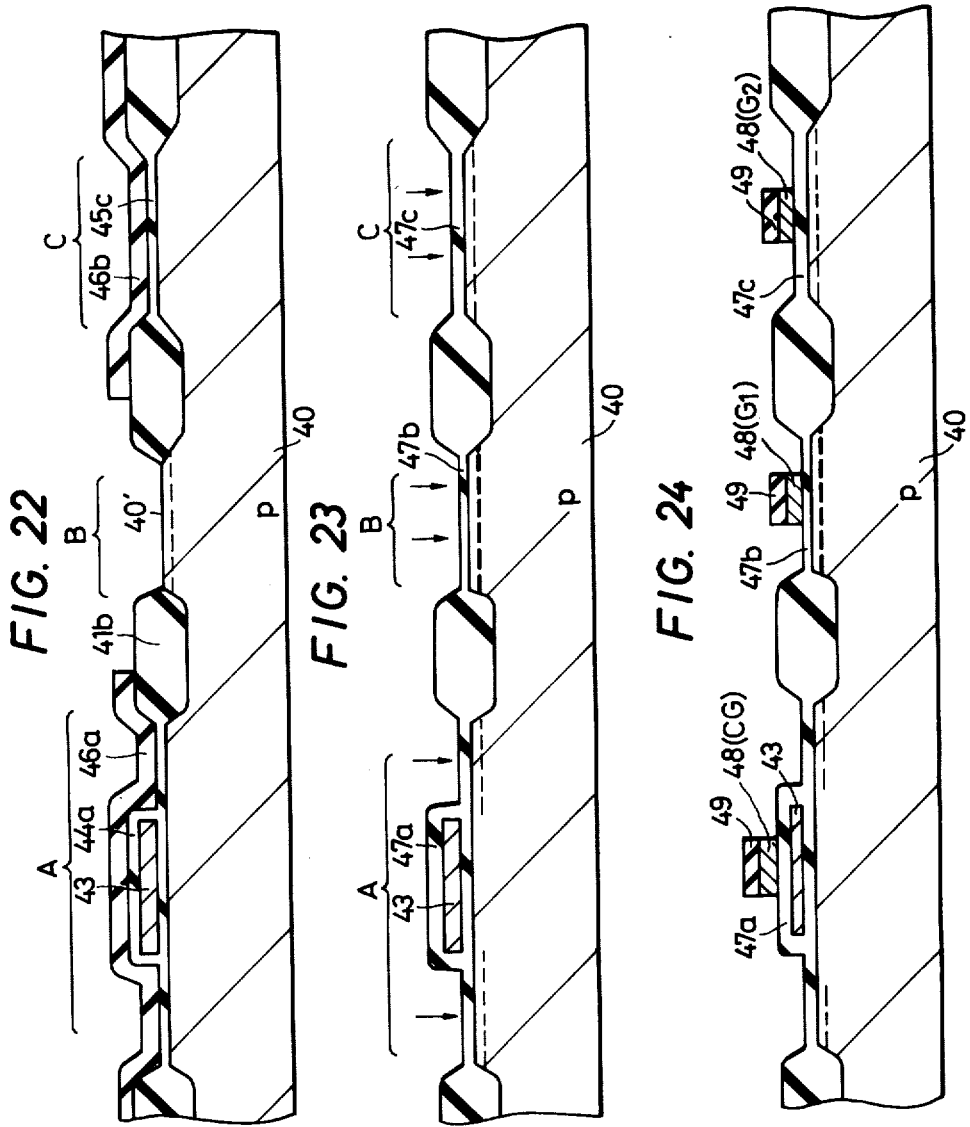

SEMICONDUCTOR INTEGRATED CIRCUIT DEVICE WITH MEMORY MISFETS AND THIN AND THICK GATE INSULATOR MISFETS

BACKGROUND OF THE INVENTION

This invention relates to semiconductor integrated circuit devices in general and more particularly to an improved EPROM (Electrically Programmable Read Only Memory) device, and a method of manufacturing the same.

In general, an EPROM device is constructed of a memory array portion and a peripheral circuit portion, such as input/output circuitry and X-Y decoder circuitry, which are formed on the major surface of a single semiconductor substrate, the memory array portion comprising a plurality of MIS (Metal-Insulator-Semiconductor) type memory transistors each having a control gate electrode over a floating gate electrode, the peripheral circuit portion being formed around the memory array portion and comprising a plurality of MIS type transistors.

An EPROM of the nature described above requires the so-called scaling-down in which, in order to render the integration density high and the operating speed high, the channel length (gate length) is made short and the thickness of a gate oxide film is made small. Since, however, writing into a memory requires a voltage higher than that for the reading, there are some parts, especially in the peripheral circuit portion, where the scaling-down is impossible.

In, for example, an n-channel type EPROM, the writing voltage has typically been 25 V and the reading voltage 5 V. Accordingly, all the MIS type transistors of the peripheral circuit portion have been put into a structure capable of enduring the writing voltage, in consideration of the simplification of a manufacturing process. That is, the gate oxide films of the respective MIS type transistors have had comparatively large thicknesses of approximately 1,000 Å. This has made it difficult to realize high speed reading.

SUMMARY OF THE INVENTION

In order to solve the above problem, the present invention uses an MIS type transistor having a thin gate oxide film and a short channel in a low voltage circuit portion for performing the reading operation, and an MIS type transistor having a thick gate oxide film and a comparatively long channel in a high voltage circuit portion for performing the writing operation.

It is accordingly an object of the present invention to provide a novel structure of a semiconductor integrated circuit device suitable for an IC, such as EPROM, which has a high density of integration and which includes a high voltage circuit, and a method of manufacturing the same. Another object of the present invention is to provide a novel method of manufacturing an EPROM in which it is possible to freely set the threshold voltages ($V_{th}$) of MIS type transistors constituting a writing circuit and MIS type transistors constituting a reading circuit.

The novel semiconductor integrated circuit device of the present invention includes a memory portion composed of MIS type memory transistors, and a peripheral portion composed of a plurality of MIS type transistors which differ, at least in thicknesses of their gate insulating films, formed on a single semiconductor substrate.

BRIEF DESCRIPTION OF THE DRAWINGS

FIGS. 4 to 18 are process sectional views of steps in one method of manufacturing an EPROM device according to the present invention.

FIGS. 19 to 26 are process sectional views of steps in another method of manufacturing an EPROM device according to the present invention.

DETAILED DESCRIPTION OF THE INVENTION

First, an EPROM device according to the present invention will be described with reference to the schematic plan view of FIG. 1.

Figure 1:
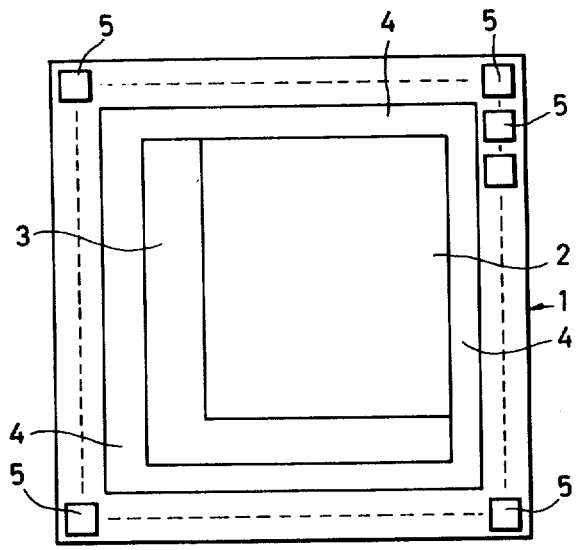
FIG. 1 is a schematic plan view of an EPROM device according to the present invention.

In FIG. 1, a semiconductor substrate 1 (semiconductor pellet) which is made of a silicon single crystal has arranged on part of its major surface a memory array portion 2 constructed of a plurality of MIS type memory transistors each of which has a gate electrode of a two-layered structure. That is, each transistor has a floating gate electrode and a control gate electrode overlying the floating gate electrode. Around the memory array portion a decoder circuit 3, an input/output circuit 4, etc., all of which are constructed of enhancement type MIS transistors, enhancement type MIS transistors having a high breakdown voltage structure, etc. are arranged as peripheral circuit portions. Terminals for external connections 5 are arrayed along the marginal edge parts of the substrate 1.

Figure 2:
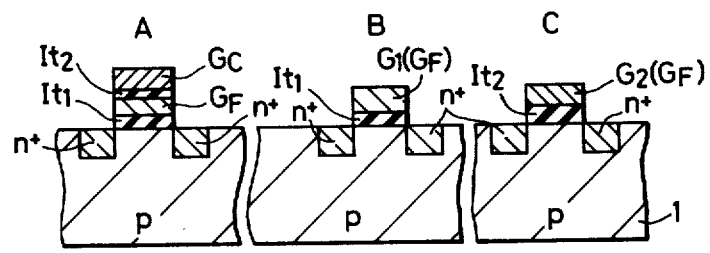
FIGS. 2 and 3 are sectional views each showing the principle structure of the present invention.

FIG. 2 is a model sectional view which shows the principle structure of the EPROM device according to the present invention. In FIG. 2, A is an MIS type memory transistor of the memory portion, and B and C are MIS type transistors of the peripheral circuit portions. Transistor B is used for a circuit of a low voltage type, for example, a 5 V type and transistor C for a circuit of a high voltage type, for example, a 25 V type. The transistor A of the memory portion has, on a P-type substrate 1, a comparatively thin gate oxide film $I_{t1}$ (500 Å), a first layer of polycrystalline silicon forming a gate electrode $G_F$, a comparatively thick inter-layer oxide film $I_{t2}$ (1,200 Å), and a second layer of polycrystalline silicon forming a gate electrode $G_C$. The MIS type transistor B of the peripheral circuit portion has a polycrystalline silicon gate electrode $G_1$ which is formed on the P-type substrate 1 through a comparatively thin gate oxide film $I_{t1}$ (500 Å). The MIS type transistor C has a polycrystalline silicon gate electrode $G_2$ which is formed on the P-type substrate 1 through a comparatively thick gate oxide film $I_{t2}$ (1,000 Å). The polycrystalline silicon gates $G_1$ and $G_2$ in the respective MIS type transistors B and C are formed by patterning the same polycrystalline silicon layer used for forming the silicon gates $C_F$ of the MIS type memory transistors of the memory portion, i.e., a first conductor layer.

Figure 3:
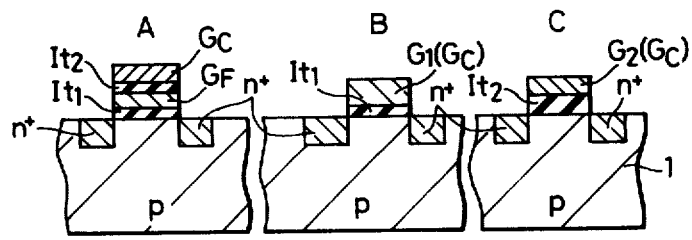

FIG. 3 shows a modification of the EPROM device in FIG. 2. A point of difference from the structure of FIG. 2 is that, in the MIS type transistors B and C of the peripheral portions, the polycrystalline silicon gate $G_1$ and the polycrystalline silicon $G_2$ are formed by patterning the same polycrystalline silicon layer used for forming the silicon gates $G_C$ of the MIS type memory transistors of the memory portion, i.e., a second conductor layer.

In the semiconductor integrated circuit device of the present invention described above, the MIS type transistor B of the low voltage type for executing a reading operation has a comparatively thin gate oxide film and has its channel length made approximately $3\mu$ and comparatively short, so that it can execute reading at high speed. On the other hand, the MIS type transistor C of the high voltage type for executing a writing operation has a comparatively thick gate oxide film and has its channel length made approximately $5\mu$ and comparatively long, so that it can satisfactorily endure the writing voltage. As described above, the semiconductor integrated circuit device of the present invention has a device structure resulting in high speed and high density, which is very suitable for EPROMs.

In the semiconductor integrated circuit device described above, the gate electrodes of the respective MIS type transistors B and C in the peripheral circuit portions are formed of the same constituent material as that of either the first layer or second layer of gate electrodes of the MIS type memory transistors of the memory portion, whereby in manufacturing the device, the process is simplified, and the threshold voltages ($V_{th}$) of the MIS type transistors constituting a writing circuit and the MIS type transistors constituting a reading circuit can be controlled and set at required values.

According to one method of the present invention for manufacturing a semiconductor integrated circuit device, in order to form gate oxide films of different thicknesses on an identical semiconductor substrate, a gate oxide film is formed on different parts of one major surface of the semiconductor substrate. Thereupon the parts of the gate oxide film which are not to be thickened are removed and gate oxidation is carried out again. Further, in the above method, in order to adjust the threshold voltages ($V_{th}$) of a gate having the thick oxide film and a gate having the thin oxide film, after the first gate oxidation an impurity is ion-implanted into the parts which are not to be thickened, and, after the subsequent gate oxidation, the ion implantation is carried out again, whereby the impurity concentration under the thick gate oxide film is made lower than that under the thin gate oxide film.

In the following Example 1, the case where the method of manufacturing a semiconductor integrated circuit device according to the present invention is applied to an EPROM device will be described with reference to the process sectional views of FIGS. 4 to 18.

EXAMPLE 1

(a) As shown in FIG. 4, a 500 Å thick SiO$_2$ (silicon dioxide) film 11 is formed by thermally oxidizing the surface of a P-type Si (silicon) single crystal substrate 10. Further, an Si$_3$N$_4$ (silicon nitride) film 12 approximately 1,500 Å thick is formed on the surface of the SiO$_2$ film 11.

(b) As shown in FIG. 5, in order to form p$^+$-type channel stoppers preventive of parasitic channels within those surface parts of the substrate 10 which are to become insulating isolation portions, the Si$_3$N$_4$ film 12 is selectively etched and removed by employing a photoresist film 13 as a mask, and thereafter, a P-type determining impurity, for example, boron is introduced into the substrate through the SiO$_2$ film 11 by the ion implantation process, whereby the p$^+$-type channel stoppers 14a, 14b, 14c and 14d are formed.

(c) As shown in FIG. 6, the photoresist film 13 is removed, whereupon the substrate 10 is heated in an oxidizing atmosphere. Thus, those surface parts of the substrate 10 which are not covered with the Si$_3$N$_4$ film 12 (p$^+$-type channel stoppers 14a, 14b, 14c and 14d) are oxidized to form 1000 Å thick SiO$_2$ films for insulating isolation (hereinbelow, termed "field SiO$_2$ films") 15a, 15b, 15c and 15d. These field SiO$_2$ films 15a, 15b, 15c and 15d divide the surface of the substrate 10 into several areas (A, B, C and D). Among them, the area A becomes a memory portion in which a plurality of MIS type memory transistors are arranged, the area B becomes a low voltage (5 V) portion in which a MIS type transistor providing a reding circuit is arranged, the area C becomes a high voltage (25 V) portion in which an MIS type transistor providing a writing circuit is arranged, and the area D becomes a high breakdown voltage portion in which an MIS type transistor having a gate electrode of a two-layered structure is arranged.

(d) As shown in FIG. 7, the Si$_3$N$_4$ film 12 and the underlying SiO$_2$ film 11 are fully removed to expose the surface of the substrate 10, whereupon the exposed surface of the substrate 10 is thermally oxidized (with dry O$_2$ at 1,000° C. for 110 minutes), thereby to form gate SiO$_2$ films 16a, 16b, 16c and 16d, each approximately 800 Å thick.

(e) In order to remove the gate SiO$_2$ films 16a and 16b formed on the respective areas A and B and to leave the SiO$_2$ films 16c and 16d formed on the respective areas C and D, a photoresist film 17 is selectively formed on the substrate 10 as shown in FIG. 8. Before the gate SiO$_2$ films 16a and 16b are etched and removed by employing the photoresist film 17 as a mask, a preceding impurity introduction for determining the threshold voltages of the memory transistors and the peripheral transistors is carried out in such a way that, using the photoresist film 17 as a mask, a boron impurity is introduced into the substrate 10 through the gate SiO$_2$ films 16a and 16b of the areas A and B by the ion implantation process. At this time, the implantation energy is about 70 KeV. The impurity concentration of the surface of the substrate (areas A and B) in which the boron impurity is introduced into the substrate 10 through the gate SiO$_2$ films 16a and 16b of the areas A and B is about $2 \times 10^{11}$ atoms/cm$^2$. Boron is not introduced into the surface of the substrate underneath the field SiO$_2$ films 15a, 15b, 15c and 15d and the photoresist film 17.

In cases where the control of the threshold voltage ($V_{th}$) of the MIS type transistor of the high voltage portion is unnecessary, the impurity introduction above described need not be executed.

(f) As shown in FIG. 9, the SiO$_2$ films 16a and 16b which are not covered with the photoresist film 17 are etched to expose the substrate surface.

(g) After removing the photoresist film 17, gate oxidation (with dry O$_2$ at 1,000° C. for 60 minutes) is carried out again as shown in FIG. 10. Owing to this gate oxidation, SiO$_2$ films 16a' and 16b' approximately 500 Å thick are formed on the areas A and B where the substrate surface is exposed. On the other hand, in the areas C and D, the gate SiO$_2$ films grow still more, and the thicknesses of the resultant SiO$_2$ films 16c' and 16d' become approximately 1,000 Å. Thereafter, in order to control the threshold voltage of the MIS type transistor of the high voltage portion to a desired value, a boron impurity is introduced into the substrate 10 through the gate SiO$_2$ film 16c' of the area C by the ion implantation process. As this ion implantation, a mask for selective ion implantation such as photoresist film is not employed, and hence, the boron impurity is also introduced into the substrate 10 corresponding to the areas A, B and D through the gate SiO$_2$ films 16a', 16b' and 16b'. At this time, the implantation energy is approximately 70 KeV. The impurity concentration of the substrate surface in which the boron impurity is introduced is $2\times10^{11}$ atoms/cm$^2$ in parts of the areas C and D. On the other hand, in the areas A and B, the preceding impurity introduction has been made as stated previously, and hence, the impurity concentration becomes $4\times10^{11}$ atoms/cm$^2$. Through the impurity introduction in this step, the threshold voltages of the MIS type transistors of the memory portion, the low voltage portion and the high breakdown voltage portion are also controlled to desired values.

According to this embodiment of the method, notwithstanding that the thicknesses of the gate SiO$_2$ films of the low voltage portion (area B) and the high voltage portion (area C) are different, the values of the threshold voltages of the transistors formed in the respective portions become approximately equal because of the surface impurity concentration of the substrate is varied.

In the case where in step (e) the ion implantation is not carried out after having formed the photoresist film 17, that is, in the case where the threshold voltages of the transistors to be formed in the low voltage portion and the high voltage portion need not be equalized, the impurity introduction in this step (g) has as its principal object controlling to desired values the threshold voltaes of the MIS type transistors of the memory portion, the low voltage portion and the high breakdown voltage portion. Therefore, the impurity concentration of the substrate surface is made $4\times20^{11}$ atoms/cm$^2$ in the areas A-D.

(h) In order to form the following gate electrodes of the MIS type transistors of the memory portion, the gate electrodes of the MIS type transistors of the peripheral circuit portion and a necessary interconnection layer, a 3,500 Å thick polycrystalline Si (silicon) layer 21 is formed on the substrate 10 by the CVD (Chemical Vapor Deposition) process. As shown in FIG. 11, using a photoresist film 22 as a mask, the polycrystalline Si layer 21 is selectively removed, by a chemical etching process or the like, to form the gate electrodes G$_1$, G$_2$ and G$_3$ of the MIS type transistors within the peripheral circuit portion and an interconnection layer L$_1$. The polycrystalline Si layer 21, the gate electrodes G$_1$, G$_2$ and G$_3$ and the interconnection layer L$_1$ are doped with a phosphorus impurity in order to establish a low sheet resistance. The doping with a phosphorus impurity is carried out before depositing the photoresist film 22. This doping with the phosphorus impurity, however, may also be carried out after forming the gate electrodes and the interconnection layer and removing the photoresist film 22.

(i) As shown in FIG. 12, after removing the photoresist film 22, the substrate 10 is heat-treated (1,000° C., 110 minutes) in a dry O$_2$ atmosphere. As a result, the respective surfaces of the polycrystalline Si layer 21, the gate electrodes G$_1$, G$_2$ and G$_3$ and the interconnection layer L$_1$ are oxidized, and SiO$_2$ films 23a, 23b, 23c, 23d and 23e approximately 1,200 Å thick are formed on the layers and the electrodes. These SiO$_2$ films play the role of inter-layer insulating films.

(j) A second layer 24 of polycrystalline Si is formed by the CVD process on the substrate 10 with substrate 10 in the state shown in FIG. 12. The thickness of the polycrystalline Si layer 24 is about 3,500 Å. The polycrystalline Si layer 24 is doped with phosphorus to give it a low resistivity. Thereafter, as shown in FIG. 13, using a photoresist film 25 as a mask, the polycrystaline Si layer 21 is successively and selectively etched to form the control gate electrodes CG$_1$ and CG$_2$ and floating gate electrodes FG$_1$ and FG$_2$ of the MIS type memory transistors.

(k) After removing the photoresist film 25, the gate SiO$_2$ film 16a' is etched. As shown in FIG. 14, using as a mask a photoresist film 26 formed anew, the polycrystalline Si layer 24 is selectively etched, to form interconnection layers L$_2$ and L$_3$ for interconnecting the MIS type transistors of the peripheral portion and an offset gate electrode G$_4$. Further, the exposed SiO$_2$ films 23b, 23c and 23e and gate SiO$_2$ films 16b', 16c' and 16d' are fully etched and removed.

Figure 15:
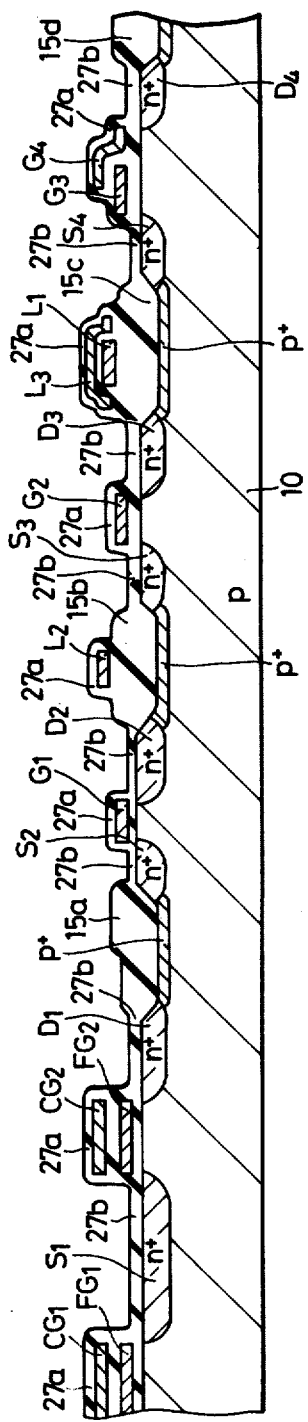

(l) As shown in FIG. 15, after removing the photoresist film 26, the substrate 10 is heated in dry O$_2$ at 1,000° C. for 30 minutes, thereby to form an SiO$_2$ film 27a of a thickness of about 500 Å on the surfaces of the gate electrodes CG$_1$, CG$_2$, G$_1$, G$_2$, G$_3$ and G$_4$ and the interconnection layers L$_2$ and L$_3$ and to form an SiO$_2$ film 27b of a thickness of about 300 Å on the exposed surface parts of the substrate 10. Thereafter, using as a mask the gate electrodes CG$_1$, CG$_2$, G$_1$, G$_2$, G$_3$ and G$_4$ and field SiO$_2$ films 15a, 15b, 15c and 15d, an n-type determining impurity such as phosphorus and arsenic is selectively introduced into the substrate 10 through the SiO$_2$ film 27b by ion implantation. Thereafter, the substrate 10 is subjected to a heat treatment, thereby to stretch and diffuse the impurity introduced in the substrate 10 and to form n-type source regions S$_1$, S$_2$, S$_3$ and S$_4$ and n-type drain regions D$_1$, D$_2$, D$_3$ and D$_4$ having a predetermined depth. The stretching diffusion may also be accomplished by heat-treating the substrate 10 after depositing a PSG film in a step (n) to be described later. In forming the source regions S$_1$, S$_2$ ... and the drain regions D$_1$, D$_2$ ..., the introduction of the impurity by ion implantation may also be replaced with a measure wherein, after removing the photoresist film 26, phosphorus or arsenic is deposited onto the exposed surface of the substrate 10 and is further subjected to the stretching diffusion. The depth of these regions is 0.3–0.5 μm, and the surface impurity concentration thereof is $10^{15}$–$10^{16}$ atoms/cm$^2$.

Figure 16:
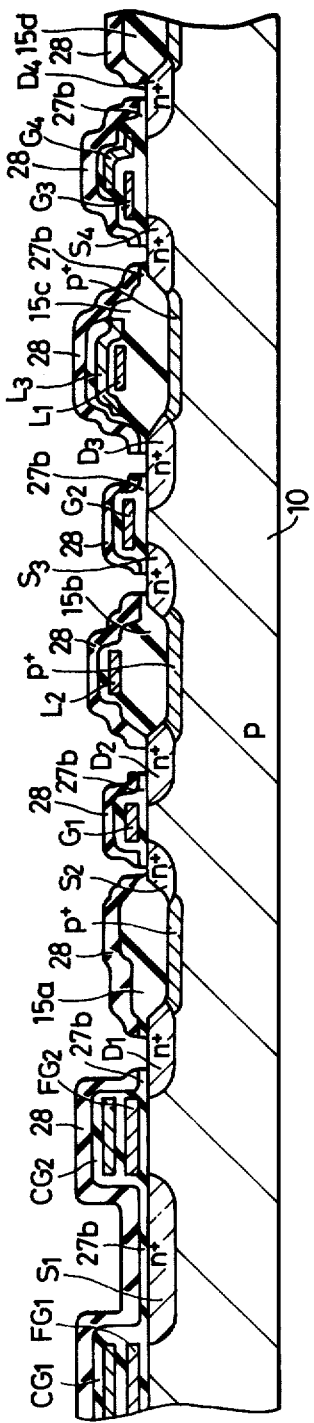

(m) As shown in FIG. 16, in order to readily form contact holes as will be described later, the SiO$_2$ film 27b overlying the source regions S$_2$, S$_3$ and S$_4$ and the drain regions D$_1$, D$_2$, D$_3$ and D$_4$ are selectively etched and removed by employing a photoresist film 28 as a mask.

(n) As shown in FIG. 17, the photoresist film 28 is removed, whereupon a phosphosilicate glass (PSG) film 29 is formed on the substrate 10 for the purposes of the stabilization of the substrate surface and the inter-layer insulation. The thickness of the PSG film 29 is approximately 6,000 Å. Using a photoresist film 30 as a mask, the PSG film 29 is selectively etched and removed to form the contact holes H$_1$, H$_2$, H$_3$ ... and H$_7$.

(o) As shown in FIG. 18, after removing the photoresist film 30, Al (aluminum) is evaporated onto the substrate 10 and is patterned to thereby form an interconnection layer 31. Although not shown, the gate electrodes $G_3$ and $G_4$ are connected by the Al interconnection layer.

By the method thus far described, the MIS type transistors $Q_1$ and $Q_2$ of the memory portion are formed along with an enhancement type MIS transistor $Q_{E1}$ for reading, an enhancement type MIS transistor $Q_{E2}$ for writing and an enhancement type MIS transistor $Q_{E3}$ having a high breakdown voltage as the MIS type transistors of the peripheral portion.

The functional effects of the above embodiment will now be explained.

(1) As apparent from FIG. 10, by performing the thermal oxidation, the gate $SiO_2$ film $16b'$ is formed in the area B anew, and simultaneously, the gate $SiO_2$ film $16c$ is shown to form the gate $SiO_2$ film $16c'$ in the area C. Accordingly, gate $SiO_2$ films $16b'$ and $16c'$ of the unequal thickness can be easily formed on the major surface of the single substrate 10.

(2) The gate electrodes $G_1$, $G_2$ and $G_3$ of the transistors of the peripheral circuit portion can be formed by the selective etching of the first layer 21 of polycrystalline Si which has been formed in the beginning in the step (h). For this reason, even when, in forming the $SiO_2$ film $23a$ as the inter-layer insulating film on the surface of the first layer 21 of polycrystalline Si in the memory portion (area A) in the step (i), phosphorus undergoes diffusion out of the first layer of polycrystalline Si layer doped with the phosphorus, the presence of the gate electrodes $G_1$, $G_2$ and $G_3$ prevents the phosphorous from being introduced into the substrate underneath the gate electrodes $G_1$, $G_2$ and $G_3$. Accordingly, the substrate surface impurity concentrations of the aresa B, C and D are not varied by the outward diffusion. In the peripheral circuit portion, therefore, transistors having stable threshold voltages are obtained.

(3) The impurity concentrations of the substrate surface parts underlying the thin gate $SiO_2$ films $16a'$ and $16b'$ are raised by the two ion implantations. Thus, the MIS type transistors formed in the substrate surface parts can be given comparatively low threshold voltages and can have their source—drain distances or channel lengths made short.

This makes it possible to fabricate a semiconductor integrated circuit device of excellent electrical characteristics and high density.

(4) Since the photoresist film 17 in the step (e) can be used as both the mask for the ion implantation and the mask for etching the $SiO_2$ film, the number of manufacturing steps can be reduced.

(5) Since the inter-layer insulating $SiO_2$ film $23a$ of the transistors of the memory portion can be formed separately form the gate $SiO_2$, films $16b'$, $16c'$ and $16d'$ of the transistors of the peripheral circuit portion, the thickness of the inter-layer insulating film can be set independently and arbitrarily.

(6) The gate electrodes of the transistors of the peripheral circuit portion are made of the first layer of polycrystalline Si layer which has been first formed and which forms the floating gate electrodes of the memory portion. Accordingly, the MIS type transistor $Q_{E3}$ which has the two-layered polycrystalline Si gate electrode structure suitable for use with high voltages can be formed in the peripheral circuit portion without increasing the number of manufacturing steps. That is, the gate electrode $G_4$ of the transistor $Q_{E3}$ is formed by selectively etching the second layer of polycrystalline Si which forms the control gate electrodes of the memory portion.

Now, another example in which this invention is applied to an EPROM device will be described with reference to process sectional views shown in FIGS. 19 to 26.

EXAMPLE 2

(a) Using the same steps as the steps (a)–(d) of Example 1 as shown in FIG. 19, field $SiO_2$ films $41a$, $41b$, $41c$ and $41d$ are formed on the surfaces of a p-type Si substrate 40, and gate $SiO_2$ films $42a$, $42b$ and $42c$ are formed to thicknesses of at most 500 Å by gate oxidation. The gate oxidation thickness is selected only in consideration of a memory portion (area A). This is because the $SiO_2$ films $42b$ and $42c$ formed in a peripheral circuit portion (areas B and C) are fully removed as will be stated later. In the figure, the area A is the memory portion in which an MIS type memory transistor is arranged, the area B is a low voltage (5 V) portion in which an MIS type transistor constituting a reading circuit is arranged, and the area C is a high voltage (25 V) portion in which an MIS type transistor constituting a writing circuit is arranged.

After forming the gate $SiO_2$ films $42a$, $42b$ and $42c$, a boron impurity is introduced into only the substrate of the area A through the gate $SiO_2$ film $42a$ by the ion implantation in order to control the threshold voltage ($V_{th}$) of the memory transistor.

(b) As shown in FIG. 20, in order to form the floating gate electrode of the memory portion, a polycrystalline Si layer having a thicknes of 3,500 Å is formed on the whole substrate 40 by the CVD process. This polycrystalline Si layer is doped with phosphorous by phosphoration. By selectively etching this polycrystalline Si layer, a polycrystalline Si layer 43 is formed on the gate $SiO_2$ film $42a$ of the area A. Thereafter, the gate $SiO_2$ films $42a$, $42b$ and $42c$ are etched to selectively expose the surface of the Si substrate 40.

(c) The second gate oxidation is carried out. In consideration of the outward diffusion of the phosphorus contained in the polycrystalline Si layer 43, before carrying out the gate oxidation, steam oxidation is executed at a low temperature (800° C.) for 10 minutes so as to simultaneously form an $SiO_2$ film of 500 Å on the surface of the polycrystalline Si layer 43 of the memory portion (area A) and an $SiO_2$ film of 100 Å on the surface of the exposed Si substrate. Thereafter, the $SiO_2$ films are etched to leave an $SiO_2$ film of 300 Å on the surface of the polycrystalline Si layer and to fully remove the $SiO_2$ film formed on the surface of the Si substrate. Subsequently, as shown in FIG. 21, the gate oxidation is performed in a dry $O_2$ atmosphere at 1,000° C. for 110 minutes, thereby to form an $SiO_2$ film (inter-layer $SiO_2$ film) $44a$ of a thickness of 1,300 Å on the surface of the polycrystalline Si layer and $SiO_2$ films (gate $SiO_2$ films) $45a$, $45b$ and $45c$ of thicknesses of 800 Å on the exposed surface of the substrate. Thereafter, photoresist films $46a$ and $46b$ are selectively formed on the substrate 40 in a manner to cover only the area A and C of the substrate. Using the photoresist films $46a$ and $46b$ as a mask, a boron impurity is selectively introduced into only the substrate of the area B through the gate $SiO_2$ film $45b$ ion implantation.

(d) As shown in FIG. 22, using the photoresist films $46a$ and $46b$ as a mask, only the gate $SiO_2$ film $45b$ of the area B is fully etched to expose the substrate surface $40'$ implanted with boron.

(e) As shown in FIG. 23, the photoresist films 46a and 46b are removed, and gate oxidation is conducted in the dry O$_2$ atmosphere at 1,000° C. for 60 minutes again. Thus, an interlayer SiO$_2$ film 47a having a thickness of 1,600 Å is formed on the surface of the polycrystalline Si layer 43 of the area A, a gate SiO$_2$ film 47B having a thickness of 500 Å is formed on the substrate surface of the area B, and a gate SiO$_2$ film 47c having a thickness of 1,000 Å is formed on the substrate surface of the area C. The gate SiO$_2$ film 47c is obtained in such a way that the gate SiO$_2$ film 45c shown in FIG. 22 is grown by this gate oxidation treatment. Thereafter, a boron impurity is introduced into the substrate by ion implantation. As a result, the surface impurity concentration of the substrate of the area B becomes $4 \times 10^{11}$ atoms/cm$^2$, and that of the substrate of the area C becomes $2 \times 10^{11}$ atoms/cm$^2$.

Also in this embodiment, in spite of the unequal thicknesses of the gate SiO$_2$ films of the low voltage portion (area B) and the high voltage portion (area C), the values of the threshold voltages of the transistors formed in the respective portions become substantially equal owing to the fact that the surface impurity concentration of the substrate is varied.

(f) A second layer 48 of polycrystalline Si is formed to a thickness of about 3,500 Å by the CVD process on the substrate 40 with substrate 40 in the state shown in FIG. 23, and it is thereafter doped with phosphorus to be put into a low resistivity state. Subsequently, a photoresist film 49 is selectively formed as shown in FIG. 24. Using the photoresist film 49 as a mask, the second layer 48 of polycrystalline Si is selectively etched to form the control gate electrode CG of the transistor of the memory portion in the area A, the gate electrode G$_1$ of the transistor of the reading portion in the area B and the gate electrode G$_2$ of the transistor of the writing portion in the area C.

Figure 25:
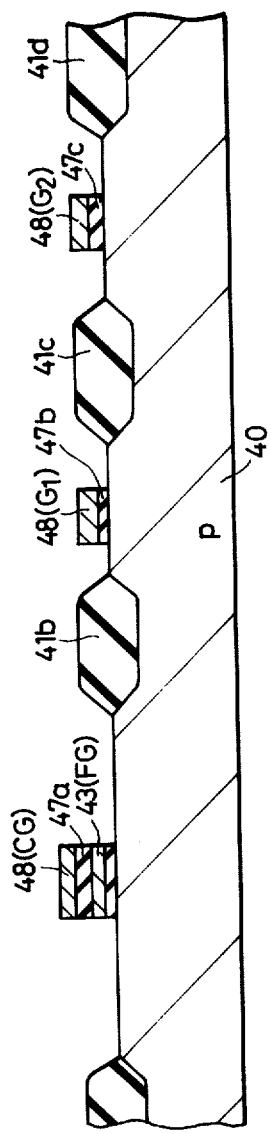

(g) As shown in FIG. 25, the exposed SiO$_2$ film 47a and the underlying polycrystalline Si layer 43 (FG) are selectivley etched. By this etching, the gate SiO$_2$ films 47b and 47c of the areas A, B and C are etched, and the substrate surface is somewhat etched.

In this case, while etching the polycrystalline Si layer 43 (FG), the side surfaces of the polycrystalline Si layer 48 are etched. In order to prevent this drawback, the whole peripheral circuit portion is preferably covered with a photoresist film when etching the polycrystalline Si layer 43 (FG).

Figure 26:
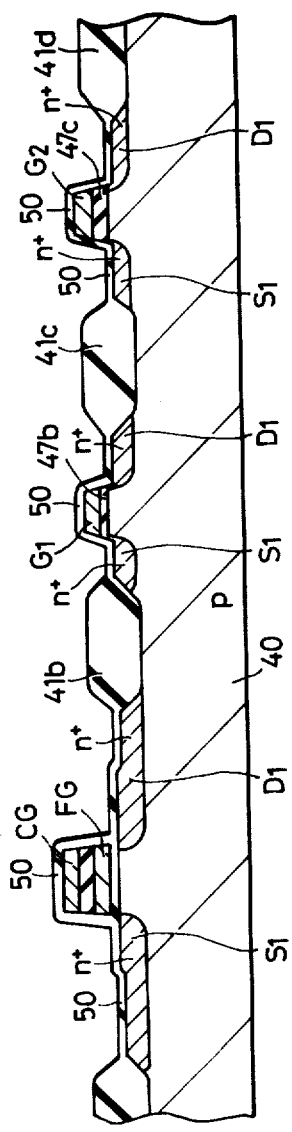

(h) As shown in FIG. 26, after removing the photoresist film 49, phosphorus or arsenic is deposited on the entire surface. Further, stretching diffusion is carried out in an oxidizing atmosphere, thereby to form n$^+$-type source regions S$_1$ and S$_2$ and N$^+$-type drain regions D$_1$ and D$_2$. During the stretching diffusion, the gate electrodes CG, G$_1$ and G$_2$ are also doped with phosphorus. At this time, SiO$_2$ film 50 is formed on the surfaces of the regions S$_1$, S$_2$, D$_1$ and D$_2$ and the surfaces of the gate electrodes CG, G$_1$ and G$_2$.

The deposition of phosphorus or arsenic may also be replaced with a measure wherein the substrate is thermally oxidized to form an SiO$_2$ film and the ion implantation of phosphorus or arsenic is subsequently carried out, followed by diffusion.

Thereafter, the resultant substrate is processed similarly to the step (m) of Example 1 (FIGS. 16–18).

With the process thus far described, MOS transistors which are formed with gate SiO$_2$ films of unequal thicknesses and whose gate elctrodes are made of the polycrystalline Si layer of the second layer (upper layer) of the memory portion transistor are obtained in the peripheral circuit parts of the identical semiconductor substrate.

Hereunder, the functional effects of Example 2 will be described.

(1) As apparent from FIG. 23, by performing the thermal oxidation in the oxidizing atmosphere, the new gate SiO$_2$ film 47b is formed in the area B, and simultaneously, the gate SiO$_2$ film 45c is grown to form the gate SiO$_2$ film 47c in the area C. Accordingly, the gate SiO$_2$ films 47b and 47c of the unequal thicknesses can be readily formed on the major surface of the single substrate 40.

(2) Since the second layer of polycrystalline Si is utilized for the gate electrodes of the peripheral circuit portion, the interconnection layout of the peripheral circuit portion is more restricted than in the foregoing Example 1. Since, however, the patterning of the second layer of polycrystalline Si is completed at once as shown in FIG. 24, the process can be simplified.

(3) The formation of the gate SiO$_2$ film (42a) of the memory portion can be made independently of the formation of the gate SiO$_2$ films (47b, 47c) of the peripheral circuit portion, and hence, the thickness of the former film can be arbitrarily selected.

(4) Regarding the adjustments of V$_{th}$ of the peripheral circuit portion, the same effect as in the case of Example 1 is achieved.

The present invention can have various modifications in addition to the foregoing embodiments. For example, the second layer of polycrystalline Si can be replaced by a conductor layer which is made of a metal material such as Mo (molybdenum). Since Mo is a high melting point metal, it can play the role of an impurity mask for forming source and drain regions. An interconnection layer formed of such metal material has lower interconnection resistance in comparison with an interconnection layer made of polycrystalline Si, and can enhance the switching speed of an EPROM device.

Figure 27:
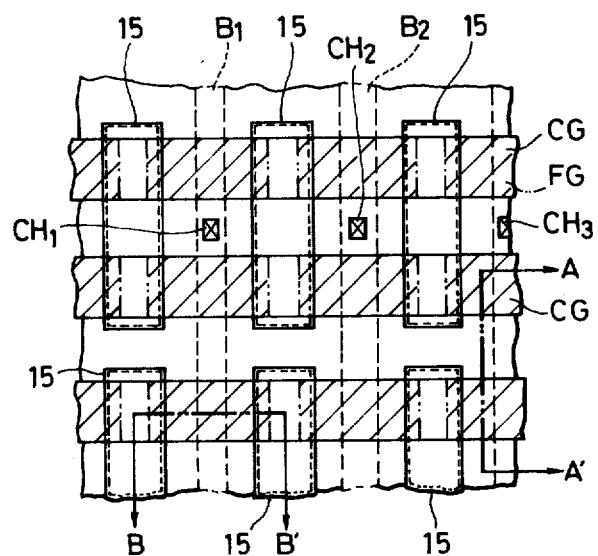
FIG. 27 is a plan view of a memory array portion according to the present invention.

The memory array portion 2 according to the present invention (refer to FIG. 1) is constructed as shown in the plan view shown of FIG. 27. In FIG. 27, numeral 15 indicates a field of SiO$_2$ film. CG indicates a control gate made of polycrystalline Si and forming a word line. FG denotes a floating gate electrode. B$_1$ and B$_2$ denote bit lines made of Al. CH$_1$–CH$_3$ indicate contact portions between the respective bit lines B$_1$–B$_3$ and the source or drain regions formed within the substrate.

Figure 28:
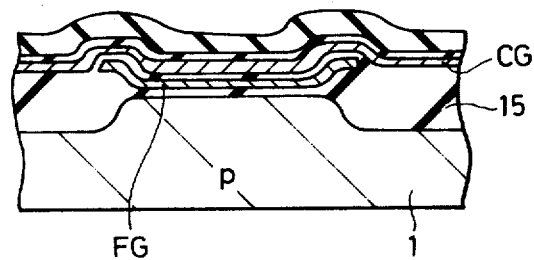
FIG. 28 is a sectional view taken along B—B' of the memory array portion shown in FIG. 27.

A section taken along A—A' in FIG. 27 has the structure of the area A in FIG. 18. A section taken along B—B' in FIG. 27 has a structure as shown in FIG. 28.

What is claimed is:

1. A semiconductor integrated circuit device comprising:
    a semiconductor substrate;
    field insulating films dividing said substrate into a number of predetermined areas;
    an MIS type memory array portion including a plurality of MIS type memory transistors disposed in a first one of said areas, said MIS type memory array portion being capable of writing and reading operations under receipt of high and low voltages, respectively;
    an MIS type peripheral circuit portion formed in said semiconductor substrate outside of said first area in association with said MIS type memory array portion and comprising a plurality of MIS type transistors which are formed at a second of said predetermined areas defined by said field insulating films, said plurality of MIS type transistors including at least first and second types of MIS type transistors which are capable of operating at said high and low voltages, respectively;

said first type of MIS type transistors each including first source and drain regions formed in said semiconductor substrate at said second predetermined area, a first gate insulating film extending over the surface portion of said semiconductor substrate between said first source and drain regions and having a substantially flat surface parallel to the underlying surface portion, and a first gate electrode formed on the flat surface of said first gate insulating film, said first gate insulating film having a thickness thinner than that of said field insulating films; and said second type of MIS type transistors each including second source and drain regions formed in said semiconductor substrate at said second predetermined area, a second gate insulating film extending over the surface portion of said semiconductor substrate between said second source and drain regions and having a substantially flat surface parallel to the underlying surface portion, and a second gate electrode formed on the flat surface of said second insulating film, said second gate insulating film having a thickness thinner than that of said first gate insulating film.

2. A semiconductor integrated circuit device as defined in claim 1, wherein the surface portions of said semiconductor substrate underlying said first gate insulating films of said first type of MIS type transistors have a first impurity concentration and the surface portions of said semiconductor substrate underlying said second gate insulating films of said second type of MIS type transistors have a second inpurity concentration different from said first impurity concentration.

3. A semiconductor integrated circuit device as defined in claim 1, wherein the surface portions of said semiconductor substrate underlying said first gate insulating films of said first type of MIS type transistors have the same impurity concentration as the surface portions of said semiconductor substrate underlying said second gate insulating films of said second type of MIS type transistors.

4. A semiconductor integrated circuit device as defined in claim 2, wherein said first impurity concentration is lower than said second impurity concentration so that said first and second types of MIS type transistors have approximately equal threshold voltages to each other.

5. A semiconductor integrated circuit device as defined in any one of claims 1-3, wherein each of said plurality of MIS type memory transistors has a floating gate electrode formed on a gate insulating film covering a portion of the predetermined area in said first location, and a control gate electrode overlying said floating gate electrode.

6. A semiconductor integrated circuit device comprising:
a semiconductor substrate of a first conductivity type;
field insulating films dividing said substrate into a number of predetermined areas;
a plurality of MIS type transistors formed in said predetermined areas of said semiconductor substrate, said plurality of MIS type transistors including at least first and second types of enhancement mode transistors which are capable of operating at high and low voltages, respectively;

said first type of enhancement mode transistors each including first source and drain regions of a second conductivity type opposite to said first conductivity type formed in said semiconductor substrate at said predetermined areas, a first gate insulating film extending over the surface portion of said semiconductor substrate between said first source and drain regions having a substantially flat surface parallel to the underlying surface portion, and a first gate electrode, formed on the flat surface of said first gate insulating film, for forming a channel region at the surface portion of said semiconductor substrate between said first source and drain regions, said first gate insulating film having a thickness thinner than that of said field insulating films;

said second type of enhancement mode transistors each including second source and drain regions of said second conductivity type formed in said semiconductor substrate at the predetermined area, a second gate insulating film extending over the surface portion of said semiconductor substrate between said second source and drain regions and having a substantially flat surface, and a second gate electrode, formed on the flat surface of said second insulating film, for forming a channel region at the surface portion of said semiconductor substrate between said second source and drain regions, said second gate insulating film having a thickness thinner than that of said first gate insulating film; and each of said surface portions serving as the channel regions of said first type of transistors having a first impurity concentration of said first conductivity type, while each of said surface portions serving as the channel regions of said second type of transistors has a second impurity concentration of said first conductivity type higher than said first impurity concentration.

7. A semiconductor integrated circuit device as defined in claim 6, wherein sid first and second impurity concentrations are defined so that said first and second types of transistors have enhancement mode threshold voltages approximately equal to each other.

8. A semiconductor integrated circuit device comprising:
a semiconductor substrate having a major surface;
a field insulating layer formed on the surface of said substrate and dividing said major surface into plural areas;
a first type of enhancement mode MIS transistors formed in ones of said plural areas, said first type of MIS transistors each including a gate insulating film having a thickness thinner than that of said field insulating layer;
a second type of enhancement mode MIS transistors formed in others of said plural areas, said second type of MIS transistors each including a gate insulating film each having a thickness thinner than that of said gate insulating film of said first type of MIS transistors;
wherein each of the surface portions of said semiconductor substrate underlying the gate insulating films for said first type of MIS transistors has an impurity concentration lower than that of each of the surface portions of said semiconductor substrate underlying the gate insulating films for said second type of MIS transistors thereby defining enhancement mode threshold voltages of both said first and second types of transistors.

* * * * *